(12) United States Patent
Sudoh

(10) Patent No.: US 7,139,137 B2
(45) Date of Patent: Nov. 21, 2006

(54) SUPPORT MECHANISM, EXPOSURE APPARATUS HAVING THE SAME, AND ABERRATION REDUCING METHOD

(75) Inventor: Yuji Sudoh, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 244 days.

(21) Appl. No.: 10/850,094

(22) Filed: May 20, 2004

(65) Prior Publication Data

US 2005/0002011 A1    Jan. 6, 2005

(30) Foreign Application Priority Data

May 21, 2003   (JP)   ............................. 2003-144186

(51) Int. Cl.
  *G02B 7/02* (2006.01)
(52) U.S. Cl. ....................... 359/811; 359/819; 359/822; 359/823
(58) Field of Classification Search ................ 359/822, 359/819, 823, 813, 811, 815
See application file for complete search history.

(56) References Cited

U.S. PATENT DOCUMENTS

| 2003/0234918 A1* | 12/2003 | Watson ........................ 355/53 |
| 2004/0008429 A1* | 1/2004 | Watson et al. .............. 359/819 |
| 2004/0059444 A1* | 3/2004 | Tsukakoshi .................. 700/59 |

FOREIGN PATENT DOCUMENTS

| JP | 2000-193869 | 7/2000 |
| JP | 2000-206389 | 7/2000 |

* cited by examiner

*Primary Examiner*—Alicia M Harrington
*Assistant Examiner*—Brandi Thomas
(74) *Attorney, Agent, or Firm*—Morgan & Finnegan, LLP

(57) ABSTRACT

A support mechanism for supporting an optical element includes a first support member for supporting the optical element, a second support member coupled to the first support member via an elastic member, and a forcing member for applying a force to the elastic member to adjust a position and/or an orientation of the optical element.

18 Claims, 9 Drawing Sheets

SUPPORT MECHANISM, EXPOSURE APPARATUS HAVING THE SAME, AND ABERRATION REDUCING METHOD

This application claims a benefit of foreign priority based on Japanese Patent Application No. 2003-144186, filed on May 21, 2003, which is hereby incorporated by reference herein in its entirety as if fully set forth herein.

BACKGROUND OF THE INVENTION

The present invention relates generally to an exposure apparatus, and more particularly to an exposure apparatus for exposing an object, such as a single crystal substrate for a semiconductor wafer and a glass plate for a liquid crystal display ("LCD").

Recent demands on smaller and thinner profile electronic devices have increasingly required finer semiconductor devices to be mounted on these electronic devices. For example, the mask-pattern design rule requires a formation of an image with a size of a line and space ("L & S") of less than 0.1 μm in an extensive area. A transfer to circuit patterns of less than 80 nm is expected in the near future. L & S denotes an image projected onto a wafer with equal line and space widths in exposure, and serves as an index of exposure resolution.

A projection exposure apparatus as a typical exposure apparatus for manufacturing semiconductor devices includes a projection optical system for exposing a pattern on a mask (reticle) onto a wafer. Effective to higher resolution are shortening of a wavelength of a light source, and increasing of a numerical aperture ("NA") of the projection optical system as well as maintaining aberrations in the projection optical system to be extremely small.

The projection optical system houses, in a lens or mirror barrel ("lens barrel"), an imaging optical system for imaging diffracted light from a reticle. When the imaging optical system has a lens that decenters from the optical axis, the light that should form an image at one point does not converge on one point, causing aberrations, such as a partial defocus, a distortion, and a curvature of field. To correct the aberrations, the projection optical system incorporates an aberration correcting optical system with the lens barrel. The aberration correcting optical system inclines a non-imaging lens that inclines (or has an tilt angle) relative to the optical axis according to the aberrational amount. The aberration correcting optical system determines a position and an orientation (or an tilt angle) of the lens according to the aberrational amount, and is configured to fix the lens as determined.

However, the above incorporation of the above aberration correcting optical system fixes the inclination of the lens to the optical axis, and therefore disadvantageously cannot correct aberrations, such as dynamically variable partial defocuses, distortions and curvatures of field, caused by a deformations (expansions, etc.) of the lenses in the imaging optical system due to environmental variances and exposure heats, such as temperature changes. In addition, the lenses in the imaging optical system are made rotated about or moved along the optical axis so as to correct the astigmatism, aspect ratio, etc. This rotations and/or movements also result in decentering from the optical axis. Insufficient corrections of the aberrations, such as the partial defocuses, distortions and curvatures of field, do not provide desired resolution.

Due to inevitable incorporation errors, it is significantly difficult to incorporate the aberration correcting optical system into the lens barrel while maintaining the lens's inclination determined and fixed by the aberrational amount. Moreover, it is bad operability to change the inclination of the lens in the aberration correcting optical system by taking out the aberration correcting optical system from the lens barrel in the projection optical system, and changing the lens's inclination, followed by reincorporation.

BRIEF SUMMARY OF THE INVENTION

Accordingly, it is an exemplary object of the present invention to provide an exposure apparatus, a support mechanism, exposure apparatus having the same, and an aberration reducing method, which improve the operability and correct variable aberrations.

A support mechanism of one aspect according to the present invention for supporting an optical element includes a first support member for supporting the optical element, a second support member coupled to the first support member via an elastic member, and a forcing member for applying a force to the elastic member. When the forcing member applies a force to the elastic member, a position and/or an orientation of the optical element are adjustable, or relative positions between the first and second support members are changed.

Preferably, the elastic member elastically deforms in a radial direction of the optical element, or about a rotational axis perpendicular to both a radial direction of the optical element and an optical-axis direction of the optical element. It is also preferable that the elastic member elastically deform substantially only in a radial direction of the optical element and about a rotational axis perpendicular to both the radial direction of the optical element and an optical-axis direction of the optical element.

A position and an amount of the force applied to the elastic member by the forcing member are preferably adjustable.

Preferably, the elastic member has first and second elastic parts, a part at which the forcing member applies the force to the elastic member is coupled to the first support member via the first elastic part, and coupled to the second support member via the second elastic part. The first and second elastic parts elastically may deform in a radial direction of the optical element, or about a rotational axis perpendicular to both a radial direction of the optical element and an optical-axis direction of the optical element. Alternatively, the first and second elastic parts elastically deform substantially only in a radial direction of the optical element and about a rotational axis perpendicular to both the radial direction of the optical element and an optical-axis direction of the optical element.

The first and second elastic parts include, for example, a flat spring, respectively. The first elastic part may include a beam that couple the first and second elastic parts to each other. The forcing member may apply the force to the first elastic part at a position that is offset from a central part in the optical-axis direction. Three elastic members may be arranged at approximately regular intervals around an outer circumference of the first support member. The he forcing member is preferably movable in an optical-axis direction of the optical element.

An optical system of another aspect according to the present invention includes at least one optical element, and the above support mechanism.

An exposure apparatus of still another aspect according to the present invention includes the above optical system for projecting a pattern on a reticle or a mask onto an object to be exposed. Typically, the optical system is a projection optical system, and the exposure apparatus may further include a measurement part for measuring an aberration of the projection optical system, which affects the object, and a controller for controlling a position and/or orientation of the optical element based on a measurement by the measurement part. The aberration includes at least one of the partial defocus, distortion, and curvature of field.

A device fabrication method of another aspect of this invention includes the steps of exposing a plate by using the above exposure apparatus, and developing the exposed object. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

A method of still another aspect according to the present invention for reducing an aberration in an optical system for projecting a pattern on a reticle or a mask onto an object, the optical system having a lens for removing the aberration, the lens being able to adjust an tilt angle relative to an optical axis includes the steps of measuring the aberration in the optical system, calculating an tilt angle of the lens relative to the optical axis to reduce the aberration when the aberration is outside a permissible range, and inclining the lens relative to the optical axis based on the tilt angle calculated by the calculating step.

Other objects and further features of the present invention will become readily apparent from the following description of the preferred embodiments with reference to accompanying drawings.

DETAILED DESCRIPTION OF THE PREFERRED EMBODIMENTS

Figure 1:
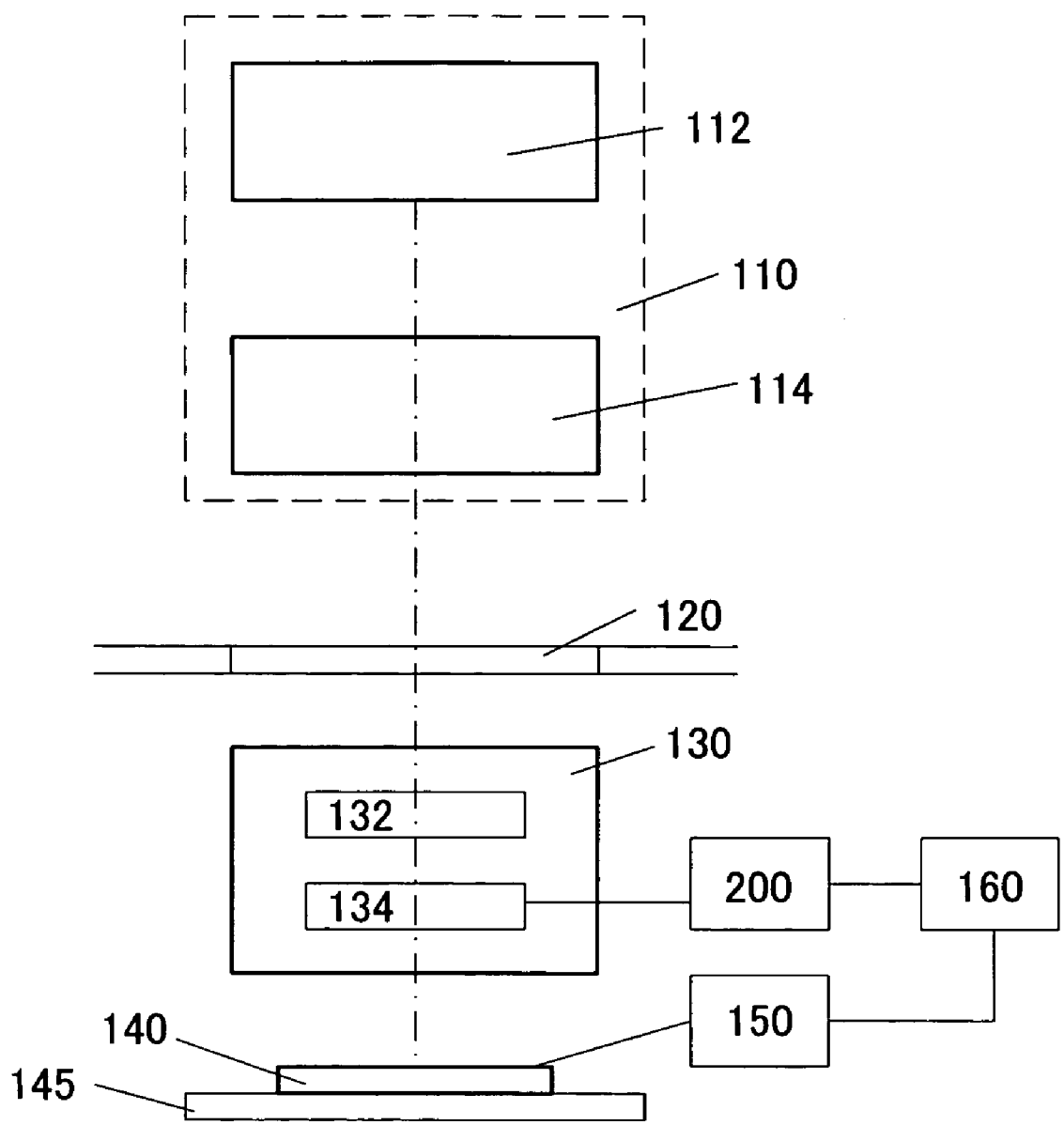
FIG. 1 is a schematic block diagram of an illustrative exposure apparatus according to the present invention.

A description will be given of an exemplary exposure apparatus 100 and adjustment (or support) mechanism 200 according to the present invention, with reference to the accompanying drawings. Here, FIG. 1 is a schematic block diagram of the exemplary exposure apparatus 100 according to the present invention. The exposure apparatus 100 includes, as shown in FIG. 1, an illumination apparatus 110, a reticle 120, a projection optical system 130, a plate 140, a measurement part 150, and a controller 160.

The exposure apparatus 100 is a projection exposure apparatus that exposes onto the plate 140 a circuit pattern created on the reticle 120, e.g., in a step-and-repeat or a step-and-scan manner. Such an exposure apparatus is suitable for a sub-micron or quarter-micron lithography process, and this embodiment exemplarily describes a step-and-scan exposure apparatus (which is also called "a scanner"). The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection.

The illumination apparatus 110 illuminates the reticle 120 which forms a circuit pattern to be transferred, and includes a light source unit 112 and an illumination optical system 114.

The light source unit 112 uses as a light source, for example, an ArF excimer laser with a wavelength of approximately 193 nm, a KrF excimer laser with a wavelength of approximately 248 nm, and a $F_2$ laser with a wavelength of approximately 157 nm but the a type of laser is not limited to excimer laser and, for example, a YAG laser may be used. Similarly, the number of laser units is not limited. For example, two independently acting solid lasers would cause no coherence between these solid lasers and significantly reduces speckles resulting from the coherence. An optical system for reducing speckles may swing linearly or rotationally. When the light source unit 112 uses laser, it is desirable to employ a beam shaping optical system that shapes a parallel beam from a laser source to a desired beam shape, and an incoherently turning optical system that turns a coherent laser beam into an incoherent one. A light source applicable to the light source unit 112 is not limited to a laser, and may use one or more lamps such as a mercury lamp and a xenon lamp.

The illumination optical system 114 is an optical system that illuminates the reticle 120, and includes a lens, a mirror, a light integrator, a stop, and the like, for example, a condenser lens, a fly-eye lens, an aperture stop, a condenser lens, a slit, and an imaging optical system arranged in this order. The illumination optical system 114 can use any light whether it is axial or off-axial light. The light integrator may include a fly-eye lens or an integrator formed by stacking two sets of cylindrical lens array plates (or lenticular lenses), and be replaced with an optical rod or a diffractive element.

The reticle 120 is made, for example, of quartz, forms a circuit pattern (or an image) to be transferred, and is supported and driven by a reticle stage (not shown). Diffracted light emitted from the reticle 120 passes the projection optical system 130, thus and then is projected onto the plate 140. The reticle 120 and the plate 140 are located in an optically conjugate relationship. Since the exposure apparatus 100 of this embodiment is a scanner, the reticle 120 and the plate 140 are scanned at the speed ratio of the reduction ratio, thus transferring the pattern on the reticle 120 to the plate 140. If it is a step-and-repeat exposure apparatus (referred to as a "stepper"), the reticle 120 and the plate 140 stand still in exposing the mask pattern.

The projection optical system 130 is an optical system for projecting light that reflects a pattern on the reticle 120 onto the plate 140. The projection optical system 130 includes an imaging optical system 132, an aberration correcting optical system 134, and the adjustment mechanism 200.

The imaging optical system 132 is an optical system for imaging light from the reticle 120 onto the plate 140. The imaging optical system 132 may use an optical system solely including a plurality of lens elements, an optical system including a plurality of lens elements and at least one concave mirror (a catadioptric optical system), an optical system including a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The aberration correcting optical system 134 is an optical system for correcting aberrations that occur on the plate 140, such as partial defocuses, distortions, and curvatures of field, when a lens element and a diffractive optical element in the imaging optical system 132 decenter from the optical axis. The aberration correcting optical system 134 includes a lens L for correcting the aberration in the projection optical system 130, which occurs on the plate 140. The lens L does not contributes to imaging of the light, and the number of lenses L depends upon the number of types of aberrations necessary to be corrected. For example, two lenses are needed to correct the partial defocus and distortion. The adjustment mechanism 200, which will be described later, can incline the lens L in the aberration correcting optical system 134 relative to the optical axis so that the lens L has a tilt angle, which is made adjustable, relative to the optical axis.

Figure 2:
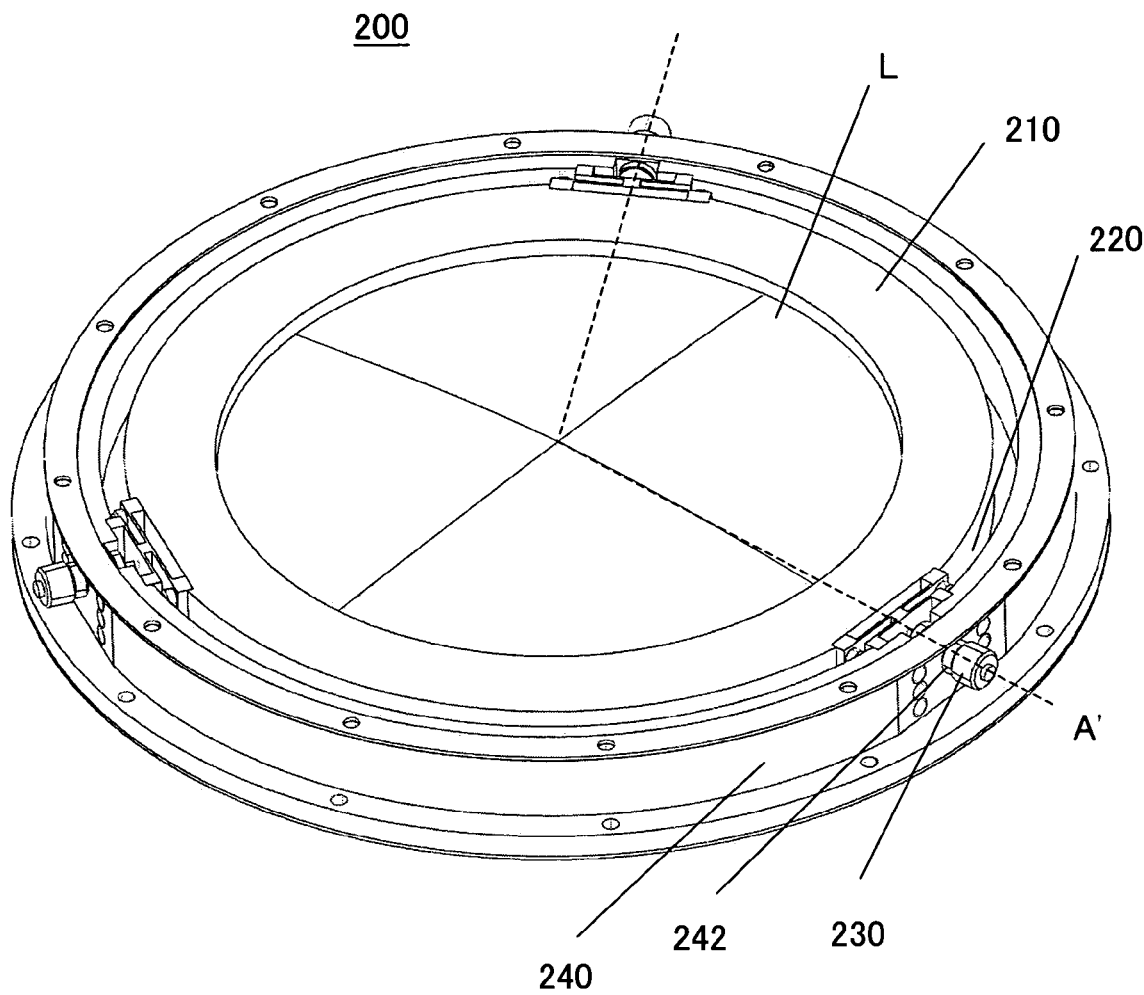
FIG. 2 is a schematic perspective view showing one example of an inventive adjusting mechanism.

The adjustment mechanism 200 adjusts a tilt angle of the lens L to the optical axis in the aberration correcting optical system 134. The adjustment mechanism 200 includes, as shown in FIG. 2, a support member 210, an elastic member 220, a compression member 230, and a lens barrel 240. FIG. 2 is a schematic perspective view of an example of the inventive adjustment mechanism 200.

The support member 210 supports the lens L over its circumference of the lens L. The support member 210 has a ring-shaped member about the optical axis, and is made of a material having a coefficient of linear expansion substantially equal to that of the lens L. For example, when the lens L is a quartz lens, the support member 210, the support member 210 uses a super-inver material. This structure can prevent deformations and stress generations in the lens L by the external force via the support member 210 when the temperature atmosphere changes and the lens L and the support member 210 change their relative positions due to a difference in coefficient of linear expansion.

Figure 3:
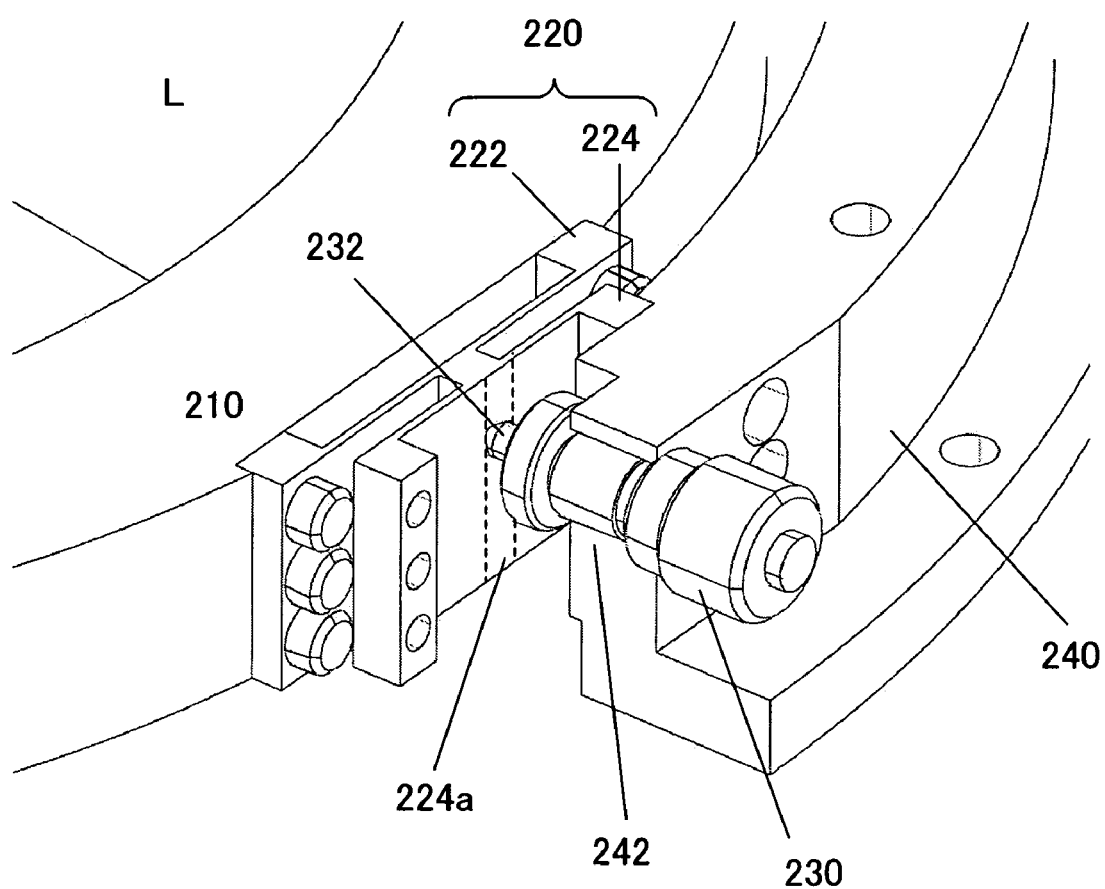
FIG. 3 is an enlarged perspective view of an elastic member shown in FIG. 2.
Figure 4:
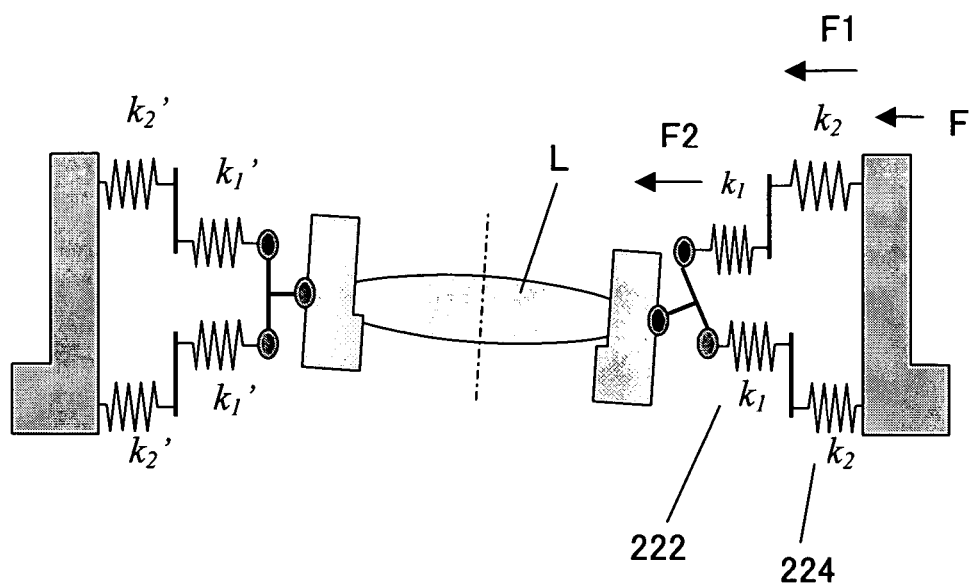
FIG. 4 is a sectional view of an equivalent model of an adjustment mechanism taken along broken line A–A' in FIG. 2.

Three elastic members 220 are arranged at 120°-pitch regular intervals at three points on the outer circumference of the support member 210, and apply elastic forces to the support member 210. In the instant embodiment, the elastic member 220 includes, as shown in FIGS. 3 and 4, a first flat spring 222 and a second flat spring 224. FIG. 3 is an enlarged view of the elastic member 220 shown in FIG. 2. FIG. 4 is a sectional view of an equivalent model of the adjustment mechanism 200 taken along a broken line A–A' in FIG. 2.

Referring to FIGS. 3 and 4, the first flat spring 222 is bendable in the lens L's radial direction and has an elastic constant k1. The first flat spring 222 is connected to the support member 210 and the second flat spring 224. The first flat spring 222 generates a first elastic force F1 from a second elastic force F2 applied by the second flat spring 224, and applies the first elastic force F1 to the support member 210. The first and second flat springs 222 and 224 may be integrated.

The second flat spring 224 can bend in the lens L's radial direction, and has an elastic coefficient k2. The second flat spring 224 is connected to the first flat spring 222 and the compression member 230, which will be described later. The second flat spring 224 generates a second elastic force F2 from a compression force F applied by the compression member 230, and applies this second elastic force F2 to the first flat spring 222. While 230 denotes the compression member in this embodiment, it may be a tension member or generalized as a forcing member (or means) for applying a force. Of course, the compression member may be a member that applies a predetermined force or displacement to the following area 224a.

The compression member 230 is connected to and compresses the elastic member 220. The compression member 230 is a micrometer, which is inserted into an insertion hole 242 in the lens barrel 240 and installed in the lens barrel 240. A bulbar part 232 at the micrometer tip contacts and can compress the area 224a, which is located at the center in the radial (or lateral) direction of the second spring 224 and can decenter in its optical-axis (or longitudinal) direction. The micrometer can adjusts the projecting amount at resolution of 10 μm or smaller by manipulations the outside of the lens barrel 240.

The lens barrel 240 supports the support member 210 via the elastic member 220, and has the insertion hole 242, into which the compression member 230 is inserted. The lens barrel 240 is made by stacking plural units in the optical-axis direction via spacers (not shown) for interval adjustments.

A description will now be given of the operation of the adjustment mechanism 200, with reference to FIG. 4. First, the compression member 230 is compressed from the outside of the lens barrel 240 by projecting the micrometer, so as to apply the compression force F to the second flat spring 224. The second flat spring 224 to which the compression force F is applied tries to deform in the lens L's radial direction, but a decentering contact in the optical-axis direction between the compression member 230 and the area 224a results in a decentering application of the compression force F. As a result, the second flat spring 224 twists and rotates about a tangential axis of the support member 210 or lens L. The second elastic force F2 generated from the compression force F for compressing the second flat spring 224 decenters when compressing the first flat spring 222. While the first flat spring 222 to which the second elastic force F2 is applied deforms in the lens's radial direction, the decentering second elastic force F2 causes the first flat spring 222 to twist and rotate about the tangential axis similar to the second flat spring 224. Thus, the first elastic force F1 generated from the second elastic force F2 for compressing the first flat spring 222 is applied obliquely to the support member 210 and inclines the lens L supported by the support member 210.

According to the finite element method ("FEM"), the structure of the instant embodiment can incline the lens L by about 1 second where the projecting amount of the compression member 230 (or the micrometer) is 10 μm. The calculated performance was experimentally confirmed.

The lens L can be adjusted to a desired tilt angle in an arbitrary direction by composing the projecting amounts of the compression members 230 located at 120°-pitch regular intervals at three points.

For example, where two lenses in the aberration correcting optical system 134 in the projection optical system 130 use the adjustment mechanism 200, the desired tilt angle is obtained by inclining two lenses by certain amounts. As a result, two types of aberrations can be reduced or corrected among the partial defocuses, distortions and curvatures of field, which are caused by decentering lens to the optical axis in the imaging optical system 132. To reduce three types of aberrations, three lenses in the aberration correcting optical system 134 may well use the adjustment mechanism 200.

When the three compression members 230 are connected to the areas 224a that do not decenter in the optical-axis direction of the second flat spring 224 (or are located at the central parts in the radial and optical-axis directions), and the projecting amounts of the compression members 230 are equalized, the shift or decentering in the optical-axis direction can be available without inclining the lens.

Figure 5:
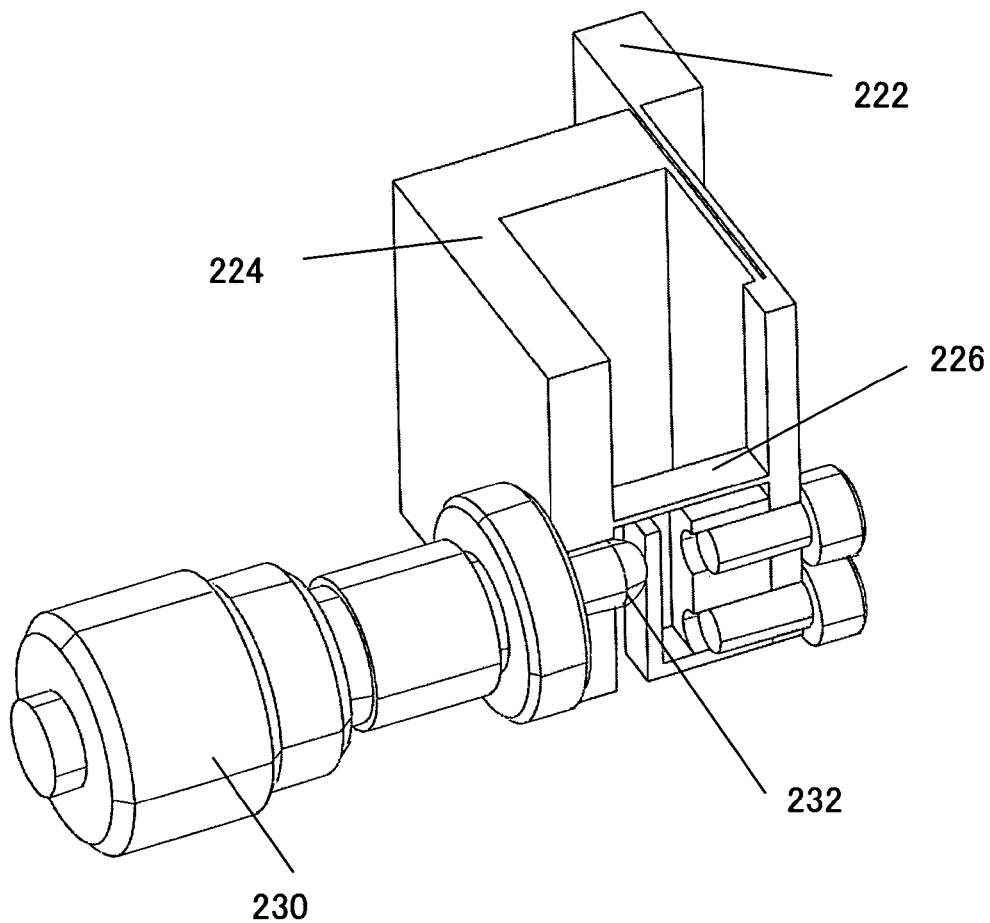
FIG. 5 is a schematic sectional view showing an elastic member when a beam is formed.

The lateral offset of the lens caused by the projection of the compression member 230 is much smaller than the inclination. However, when the variable aberrations are not impermissible in view of the optical performance as the lens mounted with the adjustment mechanism 200 laterally offsets, a beam 226 is formed between the first and second flat springs 222 and 224, as shown in FIG. 5. In other words, the beam 226 fixes the centers of rotations when the first and second flat springs 222 and 224 twist, and an adjustment to the desired tilt angle is available without the lateral offset of the lens. Here, FIG. 5 is a schematic sectional view of the elastic member 220 when the beam 226 is formed.

Since the adjustment mechanism 200 can set a desired tilt angle of the lens L in the aberration correcting optical system 134 via the elastic member 220 by projecting the compression member 230 from the outside of the lens barrel 240, the variable aberrations can be corrected with improved operability.

Figure 6:
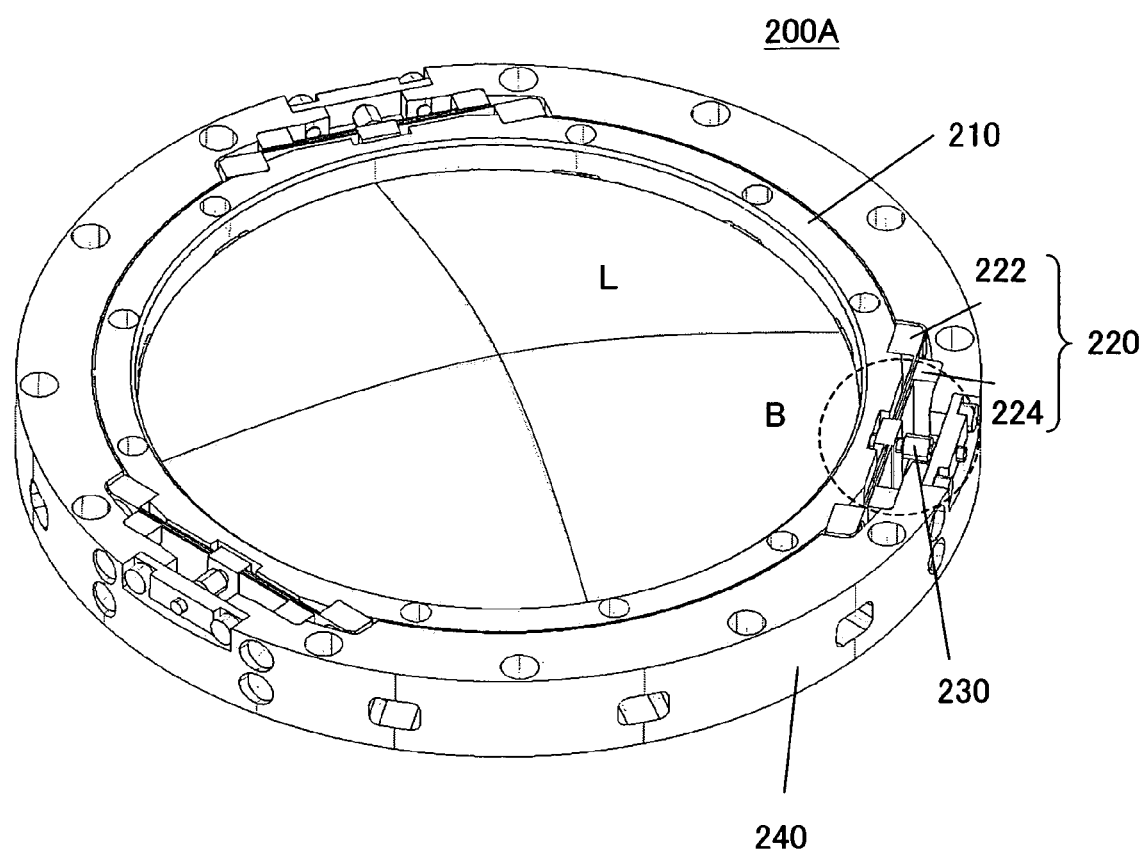
FIG. 6 is a schematic perspective view of an adjustment mechanism as a variation of that shown in FIG. 2.
Figure 7:
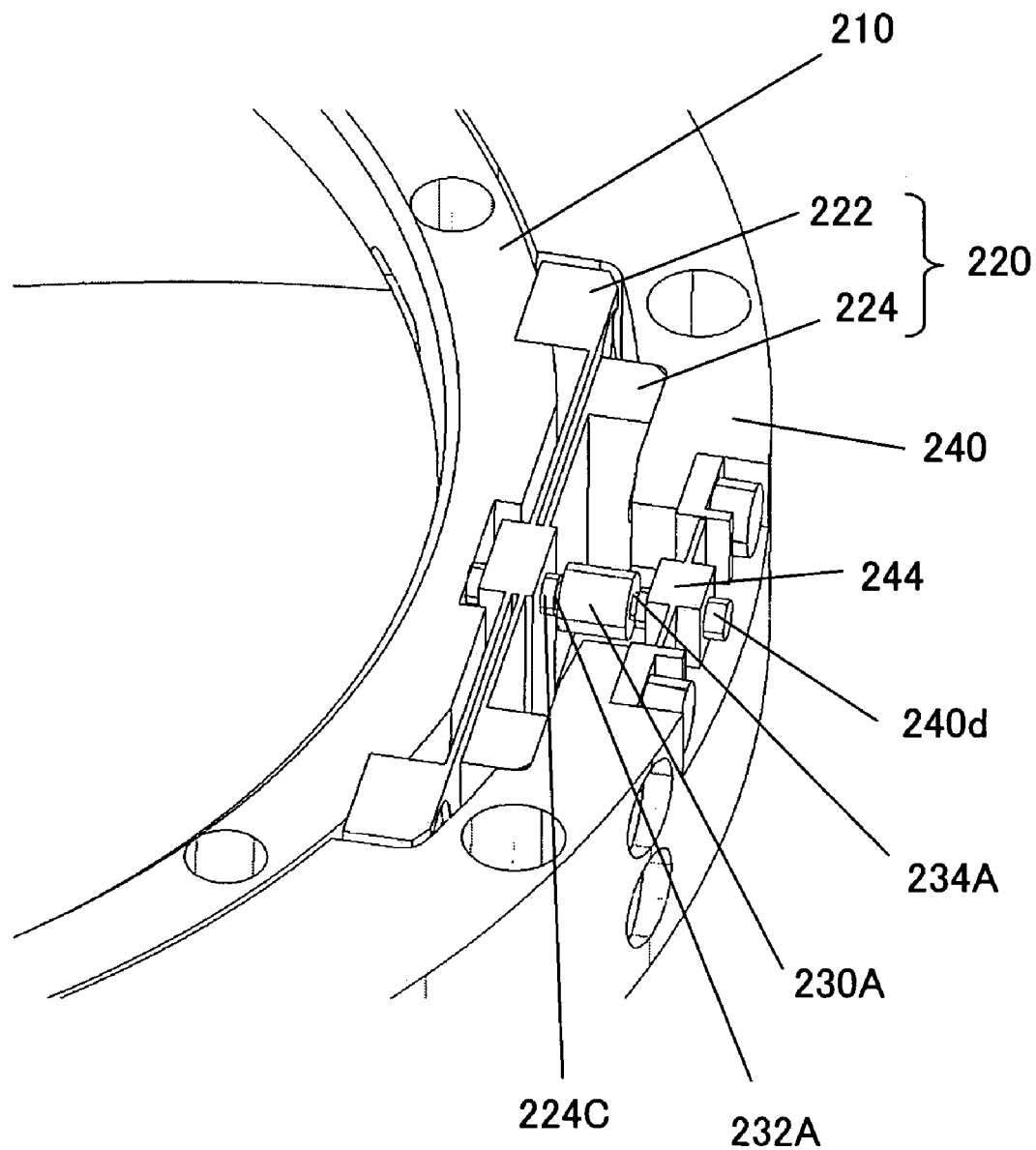
FIG. 7 is an enlarged perspective view of a compression member at a broken-line circle B in FIG. 6.

A description will be given of an adjustment mechanism 200A as a variation of the adjustment mechanism 200, with reference to FIGS. 6 and 7. The adjustment mechanism 200A is different from the adjustment mechanism 200 in a compression member 230A. Those elements in the adjustment mechanism 200A, which are the same as corresponding elements in the adjustment mechanism 200, are designated by the same reference numerals, and a duplicate description will be omitted. Here, FIG. 6 is a schematic perspective view of the adjustment mechanism 200A as a variation of the adjustment mechanism 200. FIG. 7 is the enlarged perspective view of the compression member 230A in the broken-line circle B shown in FIG. 6.

Similar to the adjustment mechanism 200, the adjustment mechanism 200A adjusts the tilt angle of the lens L in the aberration correcting optical system 134 relative to the optical axis. The adjustment mechanism 200A includes, as shown in FIG. 6, the support member 210, the elastic member 220, the compression member 230A, and the lens barrel 240.

Referring to FIG. 7, in the adjustment mechanism 200A, the compression member 230A is formed as a shaft. One end 232A of the shaft as the compression member 230A is engaged with a female spring part 224c, which is located at the central part of the second flat spring 224 in the radial (or lateral) direction and decenters in the optical-axis (or longitudinal) direction, and can translate in the lens L's radial direction. The other end 234A of the shaft is engaged with the shaft's female spring part 240d provided at the side surface of the mirror barrel 240. The shaft's other end 234A is slit for adjustments by a screwdriver from the outside of the lens barrel 240.

There is a difference in pitch between spring parts formed at the shaft's one end 232A and other end 234A, which are respectively engaged with the female spring part 224c of the second flat spring 224 and the female spring part 240d of the lens barrel 240. Therefore, one revolution of the shaft can project the second flat spring 224 in the lens L's radial direction and apply the compression force to the second flat spring 224 (or the elastic member 220).

Providing of the female spring part 240d of the lens barrel 240 engaged with the shaft's other end 234A to the spring member 244 that can displace in the lens L's radial can adjust the deformation amount of the second flat spring 224 (or the elastic member 220) with high resolution as the shaft rotates.

When the female spring part 240d in the lens barrel 240 is rotated, the adjustment mechanism 200A rotates the shaft as the compression member 230A, projects the lens L in the radial direction, and applies the compression force to the elastic member 220. At this time, a decentering connection of the one end 232A of the shaft with the elastic member 220 in the optical-axis direction applies the decentered compression force to the elastic member 220. The detailed operations of the adjustment mechanism 200A are the same as that of the above adjustment mechanism 200, and a description thereof will be omitted.

Turning back to FIG. 1, the plate 140 is an exemplary object to be exposed, such as a wafer and a LCD, and photoresist is applied to the plate 140. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic coating such as HMDS (Hexamethyl-disilazane). The pre-bake treatment is a baking (or burning) step, softer than that after development, which removes the solvent.

The stage 145 supports the plate 140. The stage 145 may use any structure known in the art, and a detailed description of its structure and operation is omitted. The stage 145 may use, for example, a linear motor to move the plate 140 in XY directions. The reticle 120 and plate 140 are, for example, scanned synchronously, and the positions of the stage 145 and a mask stage (not shown) are monitored, for example, by a laser interferometer and the like, so that both are driven at a constant speed ratio. The stage 145 is installed on a stage stool supported on the floor and the like, for example, via a damper, and the mask stage and the projection optical system 130 are installed on a lens barrel stool (not shown) supported, for example, via a damper to the base frame placed on the floor.

The measurement part 150 includes, for example, a wave front measurement apparatus, and measures aberrations in the projection optical system 130, which affects the plate 140, such as partial defocus, distortion, and curvature of field. The measurement part 150 is connected to the controller 160, and sends the detected aberration on the plate 140 to the controller 160.

The controller 160 is connected to the adjustment mechanism 200 and the measurement part 150. The controller 160 determines whether the aberration of the projection optical system 130, which is sent from the measurement part 150 and affects the plate 140, falls within the permissible range, and calculates the tilt angle of the lens L in the aberration correcting optical system 134 relative to the optical axis so that the aberration falls within the permissible range. The controller 160 controls the adjustment mechanism 200 in accordance with the calculated tilt angle of the lens L relative to the optical axis.

A description will be given of a method of calculating the tilt angle of the lens L relative to the optical axis in the instant embodiment in which the aberration correcting optical system 134 exemplarily includes lenses Lx and Ly as the lens L to correct partial defocus and distortion. A type and amount of the variable aberration when the lenses Lx and Ly incline relative to the optical axis differ according to the materials, shapes and arrangements of the lenses Lx and Ly. Accordingly, as shown in Table 1 below, a database is prepared that stores a relationship between the tilt angle of the lens L to the optical axis and the aberration.

TABLE 1

| Lenses | Inclined Angle | Variable Partial defocus | Variable Distortion |
|---|---|---|---|
| Lx | 1 Second | a | −b |
| Ly | 1 Second | a/2 | b |

Referring to FIG. 1, when the lens Lx inclines by 1 second relative to the optical axis, the partial defocus varies by "a" and the distortion varies by "−b". Similarly, when the lens Ly inclines by 1 second relative to the optical axis, the partial defocus varies by "a/2" and the distortion varies by "b". Therefore, when the lenses Lx and Ly incline by 1 second, the partial defocus varies a+a/2=3a/2 and the distortion varies by −b+b=0. Thus, a combination of tilt angles of the lenses Lx and Ly is calculated so that the set partial defocus and distortion meet the permissible range. For example, when a permissible value of the partial defocus is "a" and a permissible value of the distortion is 0, the lenses Lx and Ly are inclined by ⅔, respectively.

Figure 8:
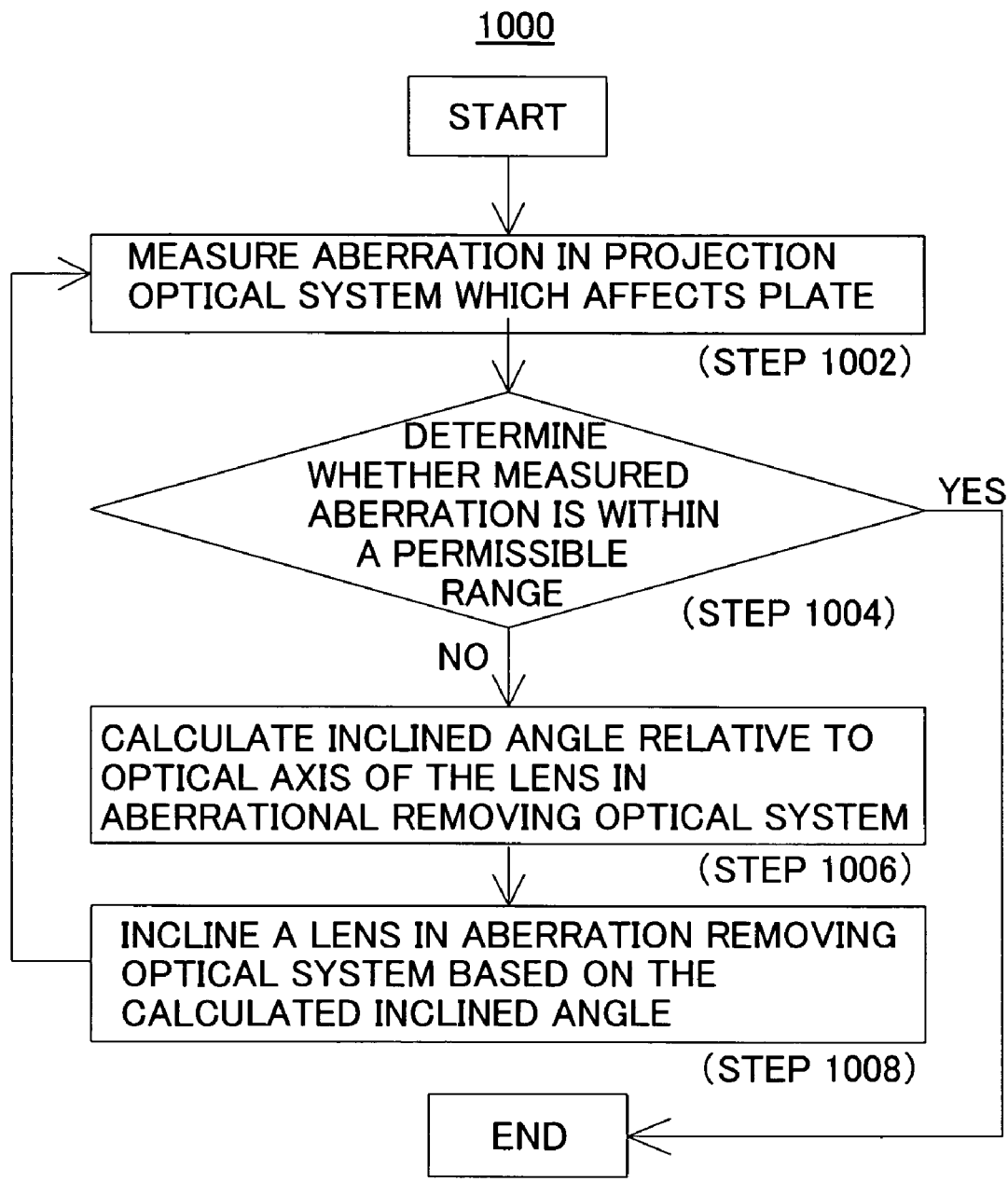
FIG. 8 is a flowchart for explaining an inventive aberration reducing method.

A description will now be given of the aberration removing method 1000 that uses the above exposure apparatus 100, with reference to FIG. 8. The aberration removing method 1000 removes aberrations in the projection optical system 130 that affects the plate 140 or the aberrations caused by decentering of the lens relative to the optical axis. FIG. 8 is a flowchart for explaining the inventive aberration removing method 1000.

First, the measurement part 150 measures the aberration in the projection optical system 130 that affects the plate 140 (step 1002). The aberration measured by the measurement part 150 is sent to the controller 160, and the controller 160 determines whether the received measured aberration falls within the permissible range (step 1004). When the measured aberration is outside the permissible range, the controller 160 calculates the tilt angle of the lens in the aberration correcting optical system 134 relative to the optical axis so as to reduce the aberration (step 1006). In addition, the controller 160 controls the adjustment mechanism 200 based on the calculated tilt angle, and inclines the lens in the aberration correcting optical system 134 (step 1008). The step 1002 and subsequent steps are repeated until the aberration measured by the step 102 falls within the permissible range. This method can reduce the aberration in the projection optical system 130 that affects the plate 140 can be reduced and provide the desired resolution.

In exposure, light emitted from the light source 112, e.g., Koehler-illuminates the reticle 120 via the illumination optical system 114. Light that passes through the reticle 120 and reflects the mask pattern is imaged onto the plate 140 by the projection optical system 130. Since the adjustment mechanism 200 reduces the aberration in the projection optical systems 130 in the exposure apparatus 100, the exposure apparatus 100 can provide high-quality devices (such as semiconductor devices, LCD devices, photographing devices (such as CCDs, etc.), thin film magnetic heads, and the like) with high throughput and economic efficiency.

Figure 9:
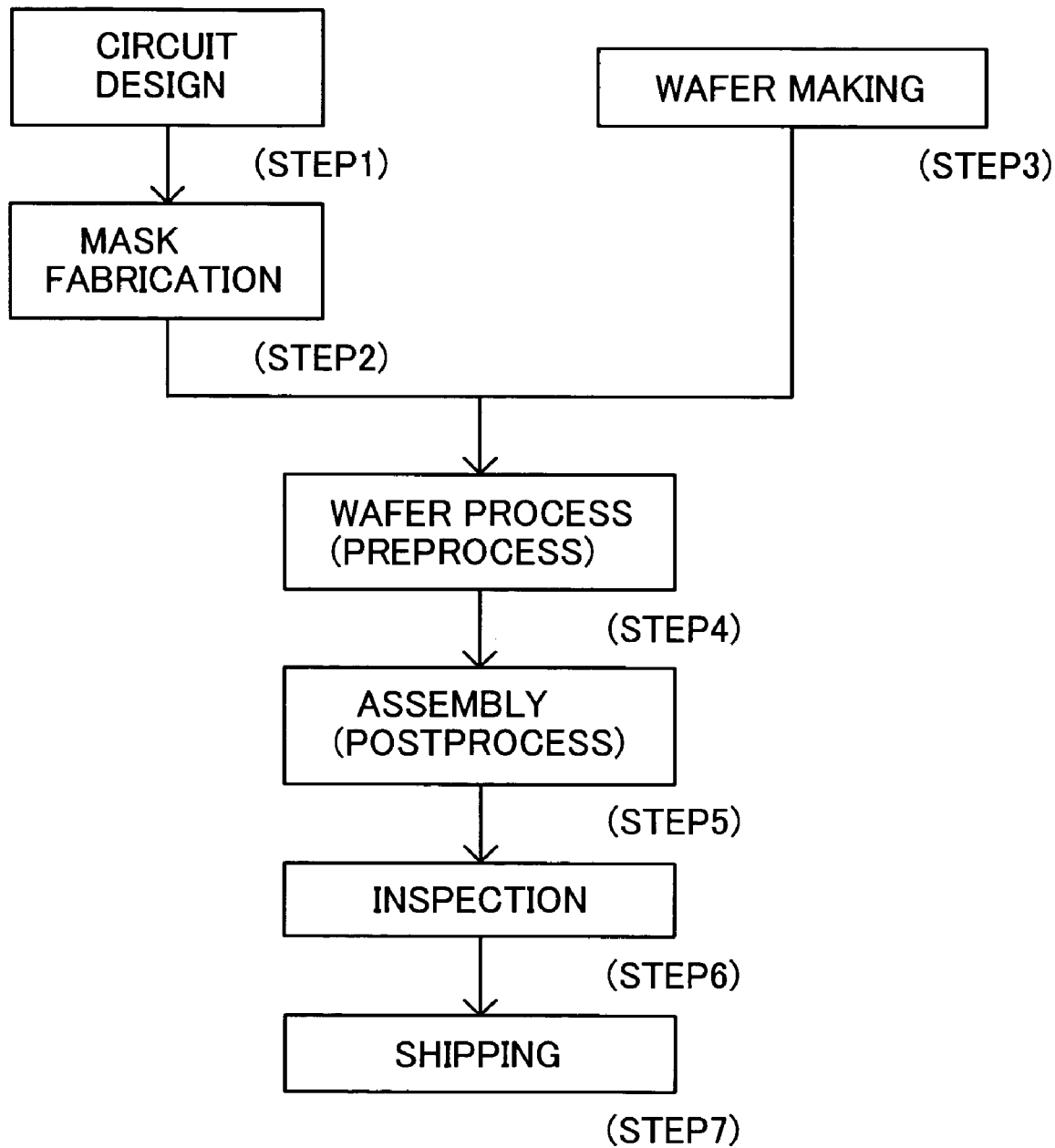
FIG. 9 is a flowchart for explaining how to fabricate devices (such as semiconductor chips such as ICs and LCDs, CCDs, and the like).
Figure 10:
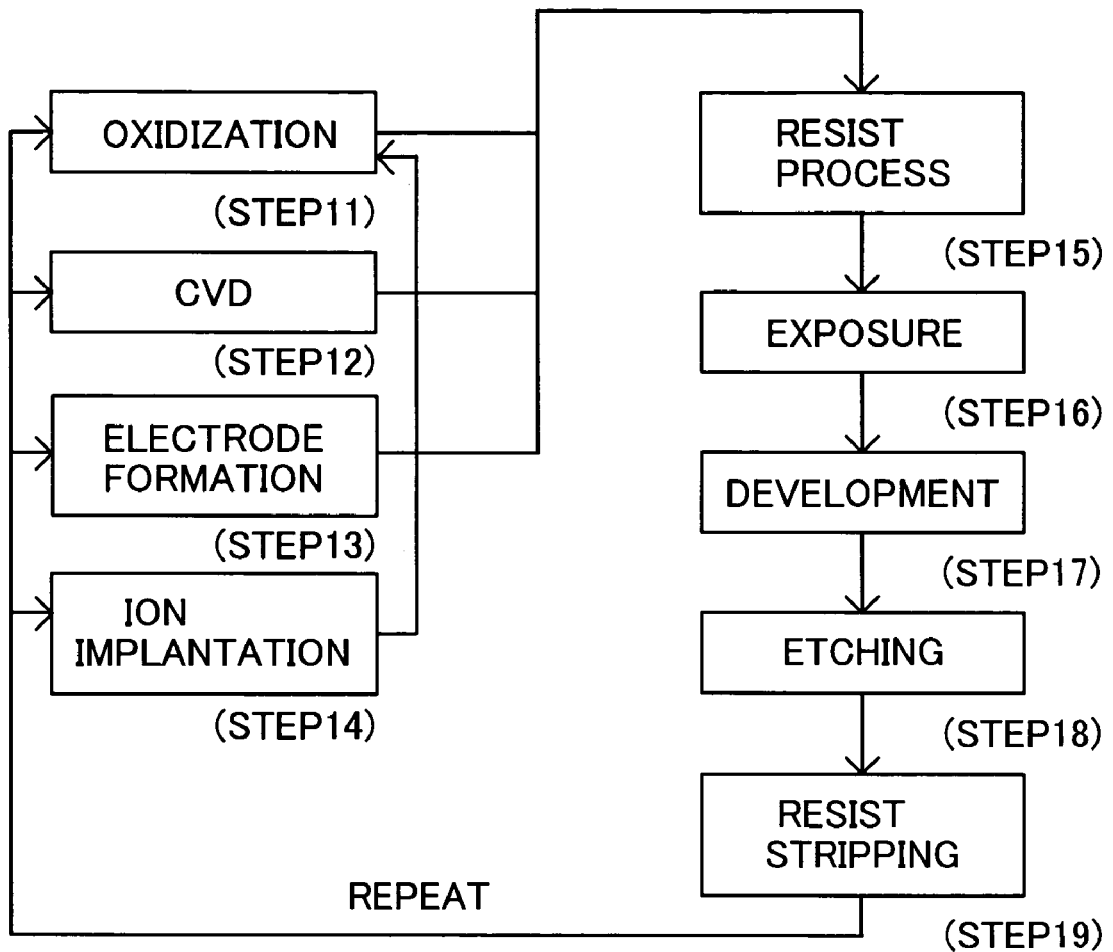
FIG. 10 is a detail flowchart of a wafer process as Step 4 shown in FIG. 9.

Referring now to FIGS. 9 and 10, a description will be given of an embodiment of a device fabrication method using the above exposure apparatus 100. FIG. 9 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than conventional.

Further, the present invention is not limited to these preferred embodiments and various variations and modifications may be made without departing from the scope of the present invention. For example, the inventive adjustment mechanism is applicable to the illumination optical system.

Thus, the inventive exposure apparatus, an aberration reducing method, and an optical-element adjusting mechanism can improve the operability and correct variable aberrations.

What is claimed is:

1. A support mechanism for supporting an optical element, said support mechanism comprising:
   a first support member for supporting the optical element;
   a second support member coupled to said first support member via an elastic member; and
   a forcing member for applying a force to the elastic member to adjust a position and/or an orientation of the optical element,
   wherein the elastic member elastically deforms substantially in a radial direction of the optical element and in the presence of an offset force from the forcing member also twists about a rotational axis perpendicular to both the radial direction of the optical element and an optical-axis direction of the optical element.

2. A support mechanism for supporting an optical element, said support mechanism comprising:
- a first support member for supporting the optical element;
- a second support member coupled to said first support member via an elastic member; and
- a forcing member for applying a force to the elastic member to adjust a position and/or an orientation of the optical element,
- wherein the elastic member has first and second elastic parts, a part at which said forcing member applies the force to the elastic member is coupled to said first support member via the first elastic part, and coupled to said second support member via the second elastic part.

3. A support mechanism according to claim 2, wherein said first and second elastic parts elastically deform in a radial direction of the optical element.

4. A support mechanism according to claim 2, wherein said first and second elastic parts elastically deform about a rotational axis perpendicular to both a radial direction of the optical element and an optical-axis direction of the optical element.

5. A support mechanism according to claim 2, wherein the first and second elastic parts elastically deform substantially only in a radial direction of the optical element and about a rotational axis perpendicular to both the radial direction of the optical element and an optical-axis direction of the optical element.

6. A support mechanism according to claim 2, wherein the first and second elastic parts include a flat spring, respectively.

7. A support mechanism according to claim 2, wherein the first elastic part includes a beam that couple the first and second elastic parts to each other.

8. A support mechanism according to claim 2, wherein the forcing member applies the force to the first elastic part at a position that is offset from a central part in the optical-axis direction.

9. A support mechanism according to claim 2, wherein three elastic members are arranged at approximately regular intervals around an outer circumference of said first support member.

10. A support mechanism for supporting an optical element, said support mechanism comprising:
- a first support member for supporting the optical element;
- a second support member coupled to said first support member via an elastic member; and
- a forcing member for applying a force to the elastic member to change relative positions between said first and second support members,
- wherein the elastic member elastically deforms substantially in a radial direction of the optical element and in the presence of an offset force from the forcing member also twists about a rotational axis perpendicular to both the radial direction of the optical element and an optical-axis direction of the optical element.

11. A support mechanism for supporting an optical element, said support mechanism comprising:
- a first support member for supporting the optical element;
- a second support member coupled to said first support member via an elastic member; and
- a forcing member for applying a force to the elastic member to change relative positions between said first and second support members,
- wherein the elastic member has first and second elastic parts, a part at which said forcing member applies the force to the elastic member is coupled to said first support member via the first elastic part, and coupled to said second support member via the second elastic part.

12. A support mechanism according to claim 11, wherein said first and second elastic parts elastically deform in a radial direction of the optical element.

13. A support mechanism according to claim 11, wherein said first and second elastic parts elastically deform about a rotational axis perpendicular to both a radial direction of the optical element and an optical-axis direction of the optical element.

14. A support mechanism according to claim 11, wherein the first and second elastic parts elastically deform substantially only in a radial direction of the optical element and about a rotational axis perpendicular to both the radial direction of the optical element and an optical-axis direction of the optical element.

15. A support mechanism according to claim 11, wherein the first and second elastic parts include a flat spring, respectively.

16. A support mechanism according to claim 11, wherein the first elastic part includes a beam that couple the first and second elastic parts to each other.

17. A support mechanism according to claim 11, wherein the forcing member applies the force to the first elastic part at a position that is offset from a central part in the optical-axis direction.

18. A support mechanism according to claim 11, wherein three elastic members are arranged at approximately regular intervals around an outer circumference of said first support member.

* * * * *